United States Patent
Jia et al.

(10) Patent No.: US 11,205,494 B2
(45) Date of Patent: Dec. 21, 2021

(54) NON-VOLATILE MEMORY DEVICE AND CONTROL METHOD

(71) Applicant: YANGTZE MEMORY TECHNOLOGIES CO., LTD., Wuhan (CN)

(72) Inventors: Jianquan Jia, Wuhan (CN); Kaikai You, Wuhan (CN); Ying Cui, Wuhan (CN); Kaiwei Li, Wuhan (CN); Yali Song, Wuhan (CN); Shan Li, Wuhan (CN); An Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/179,356

(22) Filed: Feb. 18, 2021

(65) Prior Publication Data
US 2021/0174884 A1    Jun. 10, 2021

Related U.S. Application Data

(63) Continuation of application No. 16/718,217, filed on Dec. 18, 2019, now Pat. No. 10,957,408, which is a
(Continued)

(51) Int. Cl.
*G11C 7/00* (2006.01)
*G11C 16/34* (2006.01)
(Continued)

(52) U.S. Cl.
CPC ...... *G11C 16/3427* (2013.01); *G11C 16/0483* (2013.01); *G11C 16/08* (2013.01); *G11C 16/24* (2013.01)

(58) Field of Classification Search
CPC ......... G11C 16/10; G11C 16/30; G11C 16/12; G11C 16/0483
(Continued)

(56) References Cited

U.S. PATENT DOCUMENTS 9,171,627 B2 * 10/2015 Lee .................... G11C 16/0483
9,443,579 B2    9/2016 Lee
(Continued)

FOREIGN PATENT DOCUMENTS

CN    104599704 A    5/2015
CN    107767911 A    3/2018
(Continued)

*Primary Examiner* — Son T Dinh
(74) *Attorney, Agent, or Firm* — Bayes PLLC

(57) ABSTRACT

A memory device includes a memory array including memory strings. Each memory string includes a plurality of top memory cells, a plurality of bottom memory cells, and one or more dummy memory cells between the top memory cells and the bottom memory cells. The memory device also includes a plurality of word lines respectively coupled to gate terminals of the top memory cells and the bottom memory cells, and one or more dummy word lines respectively coupled to gate terminals of the one or more dummy memory cells. The memory device further includes a control circuit configured to program a target memory cell coupled to a selected word line of the plurality of word lines. To program the target memory cell, the control circuit is configured to apply a biased dummy word line pre-pulse signal to the one or more dummy word lines in a pre-charge period prior to a programming period.

18 Claims, 5 Drawing Sheets

Related U.S. Application Data continuation of application No. PCT/CN2019/114619, filed on Oct. 31, 2019.

(51) Int. Cl.
*G11C 16/04* (2006.01)
*G11C 16/08* (2006.01)
*G11C 16/24* (2006.01)

(58) Field of Classification Search
USPC .............................. 365/203, 185.19, 185.18
See application file for complete search history.

(56) References Cited

U.S. PATENT DOCUMENTS

| | | | |
|---|---|---|---|
| 9,830,992 | B1 | 11/2017 | Tsai |
| 10,008,271 | B1 | 6/2018 | Diep |
| 10,163,475 | B2 * | 12/2018 | Yu ........................... G11C 16/10 |
| 10,276,250 | B1 | 4/2019 | Chen |
| 10,297,323 | B2 | 5/2019 | Yu |
| 10,297,330 | B2 | 5/2019 | Zhang |
| 2014/0233316 | A1 | 8/2014 | Shim |
| 2014/0241064 | A1 | 8/2014 | Lee |
| 2014/0241069 | A1 | 8/2014 | Kwak |
| 2015/0003169 | A1 | 1/2015 | Nam |
| 2015/0221373 | A1 | 8/2015 | Nam |
| 2015/0287479 | A1 | 10/2015 | Nam |
| 2015/0294726 | A1 * | 10/2015 | Sim ..................... G11C 16/0483 365/185.12 |
| 2015/0318045 | A1 | 11/2015 | Yun |
| 2018/0218775 | A1 | 8/2018 | Kim |
| 2019/0035478 | A1 | 1/2019 | Lee et al. |
| 2019/0147955 | A1 | 5/2019 | Chen |
| 2019/0189218 | A1 | 6/2019 | Izumi |

FOREIGN PATENT DOCUMENTS

| | | |
|---|---|---|
| CN | 108074603 A | 5/2018 |
| CN | 109378028 A | 2/2019 |

* cited by examiner

NON-VOLATILE MEMORY DEVICE AND CONTROL METHOD

CROSS REFERENCE TO RELATED APPLICATIONS

This application is a continuation of U.S. application Ser. No. 16/718,217, filed on Dec. 18, 2019, which is a continuation of International Application No. PCT/CN2019/114619, filed on Oct. 31, 2019, both of which are incorporated herein by reference in their entireties.

BACKGROUND

The present disclosure is related to a non-volatile memory device and a control method, and more particularly to a non-volatile memory device and a control method capable of applying negative pre-pulse to dummy cell for reducing programming disturb.

Non-volatile memory devices, such as flash memory, have become the storage of choice in various electrical products, such as personal computers, flash drives, digital cameras, and mobile phones. Flash memory devices have undergone rapid development. The flash memory can store data for a considerably long time without powering, and have advantages such as high integration level, fast access, easy erasing, and rewriting.

To further improve the bit density and reduce cost of the flash memory device, a three-dimensional (3D) NAND flash memory has been developed. A 3D NAND memory architecture stacks memory cells vertically in multiple layers, achieving a higher density than traditional NAND memory. As more layers are added, the bit density increases, and thus increasing more storage capacity. The 3D NAND flash memory is to take one NAND deck and stack another NAND deck on the top of the NAND deck. And such like this, multiple layers of memory cells can be stacked to form the 3D NAND memory. Please refer to FIG. 1, which is a schematic diagram of a conventional non-volatile memory device having the NAND-type memory string. As shown in FIG. 1, two typical-NAND structures are stacked to form a memory string. The memory string includes a lower deck LD and an upper deck UD. Each of the lower deck LD and the upper deck UD may include multiple layers of memory cells. Several layers of memory cells neighboring the connecting junction of the lower deck LD and the upper deck UD (i.e., the connecting junction of the two stacked NAND structures) are usually applied as dummy memory cells due to the manufacturing process and electrical characteristics.

During the programming period of the memory cells of the upper deck UD, the dummy memory cells neighboring the connecting junction of the lower deck LD and the upper deck UD are usually arranged in an initial state in order to avoid any possible threshold voltage shift of the dummy memory cells due to the poor process characteristics of the dummy memory cell neighboring the stacked connecting junction and the program/erase operation cycles of the upper deck UD. However, after a memory cell of the upper deck UD, which is adjacent to connecting junction of the lower deck LD and the upper deck UD, is programmed, the channel would be cut off. Under such a situation, the effect of bit line pre-charge for the dummy memory cells neighboring the connecting junction will become ineffective and the threshold voltage of dummy memory cell would become low. As such, residual electrons of the channel may remain trapped and gathered in the region of the dummy memory cells neighboring the connecting junction of the stacked decks due to the low threshold voltage, and thus influencing programming boost potential of a memory cell adjacent to the previously programmed memory cell, reducing channel boost potential and resulting in programming disturb. As a result, the memory cells of the upper deck UD would be easily affected by the programming disturb effect due to the characteristic of the connecting junction of the stacked structure. Thus, there is a need for improvement.

SUMMARY

It is therefore an objective of the present disclosure to provide a non-volatile memory device and a control method capable of capable of applying negative pre-pulse to dummy cell for reducing programming disturb.

An embodiment provides a non-volatile memory device. The non-volatile memory device includes a memory array comprising a plurality of memory strings, each memory string comprising a plurality of top memory cells connected in series, a plurality of dummy memory cells connected in series with the plurality of top memory cells and a plurality of bottom memory cells connected in series with the plurality of dummy memory cells; a bit line connected to a first memory string of the plurality of memory strings; a plurality of word lines connected to the plurality of top memory cells and the plurality of bottom memory cells of the first memory string of the plurality of memory strings, each word line connected to a respective top memory cell or a respective bottom memory cell of the first memory string; a plurality of dummy word lines connected to the plurality of dummy memory cells; a first control circuit configured to apply a bit line pre-pulse signal to the bit line during a pre-charge period; and a second control circuit configured to apply a selected word line signal to a selected word line of the plurality of word lines, apply an unselected word line signal to unselected word lines of the plurality of word lines and apply a negative pre-pulse signal to the plurality of dummy word lines during the pre-charge period.

Another embodiment provides a control method of non-volatile memory device. The non-volatile memory device includes a plurality of top memory cells connected in series, a plurality of dummy memory cells connected in series with the plurality of top memory cells and a plurality of bottom memory cells connected in series with the plurality of dummy memory cells. The control method includes applying a bit line pre-pulse signal to a bit line connected to a first memory string of the plurality of memory strings during a pre-charge period; applying a selected word line signal to a selected word line of the plurality of word lines and applying an unselected word line signal to unselected word lines of the plurality of word lines during the pre-charge period; and applying a negative pre-pulse signal to the plurality of dummy word lines connected to the plurality of dummy memory cells during the pre-charge period.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
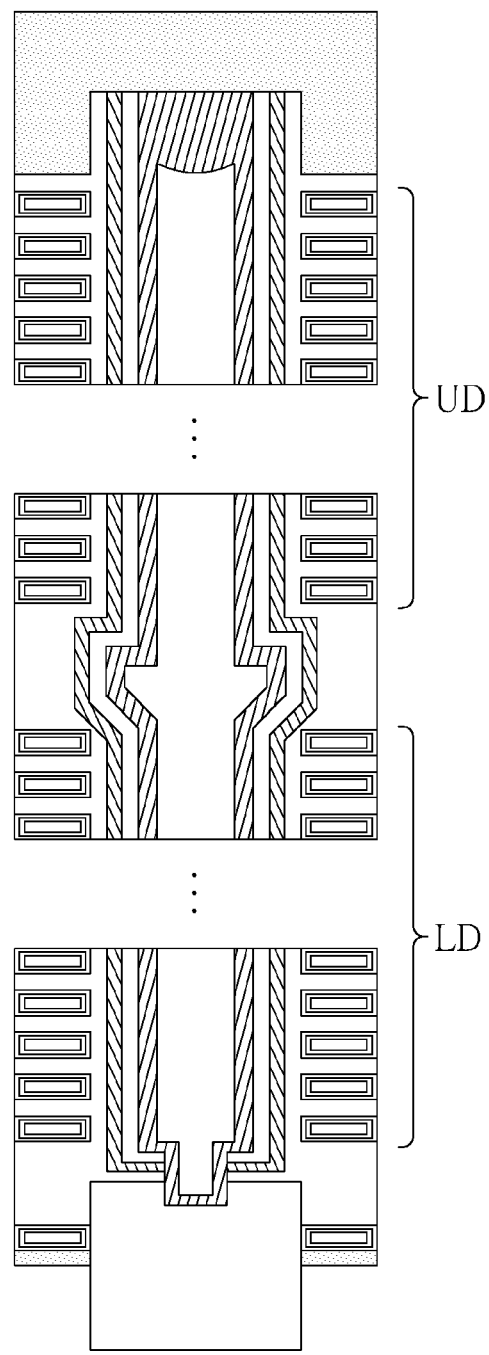
FIG. 1 is a schematic diagram of a conventional non-volatile memory device having the NAND-type memory string.
Figure 2:
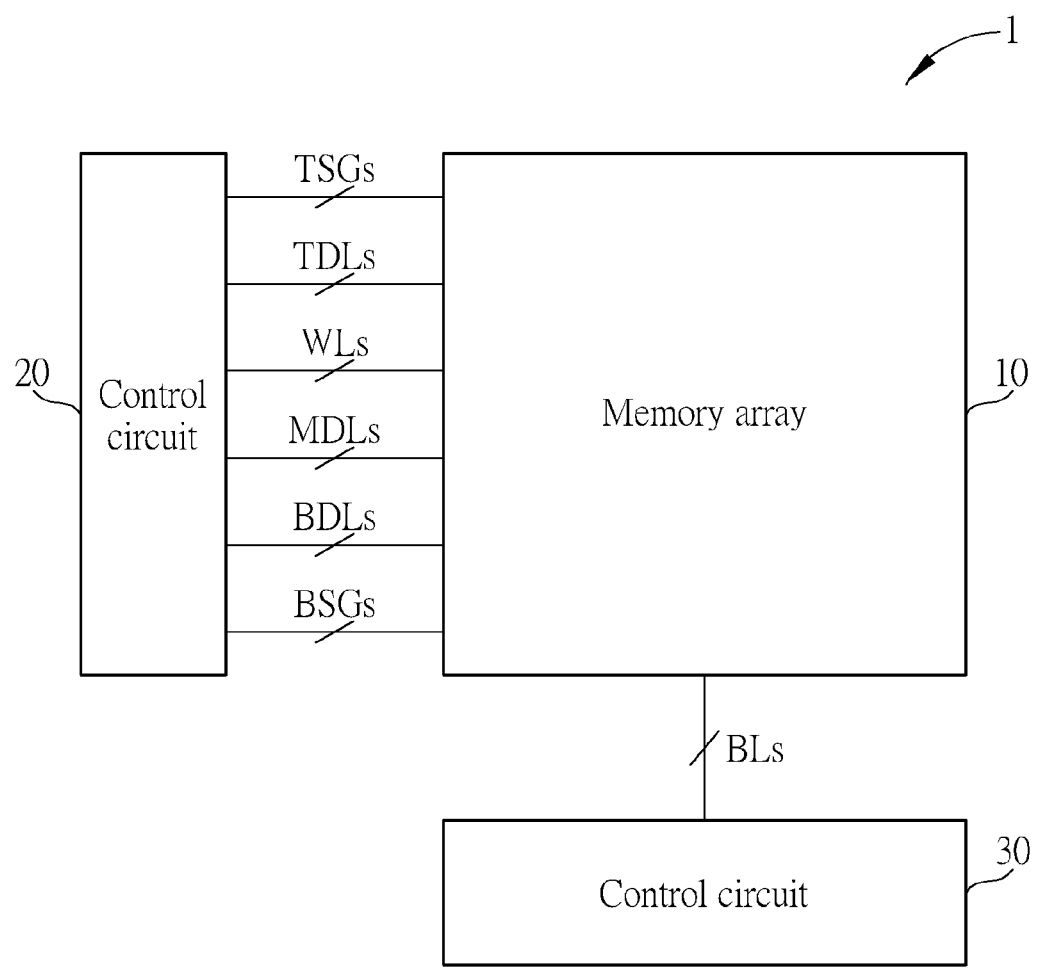
FIG. 2 is a schematic diagram of a non-volatile memory device according to an embodiment of the present disclosure.

Please refer to FIG. 2, which is a schematic diagram of a non-volatile memory device 1 according to an embodiment of the present disclosure. The non-volatile memory device 1 may be a NAND flash memory. For example, the non-volatile memory device 1 may be a three-dimensional (3D) NAND flash memory. The non-volatile memory device 1 includes a memory array 10 and control circuits 20 and 30. The memory array 10 includes a plurality of memory strings. Each memory string includes a plurality of memory cells. The memory cells of each string are connected together in series. The intersection of a word line and a semiconductor channel forms a memory cell. Top select gate lines TSGs, word lines WLs, top dummy word lines TDLs, middle dummy word lines MDLs, bottom dummy word lines BDLs and bottom select gate lines BSGs are connected between the memory array 10 and the control circuit 20. Bit lines BLs are connected between the memory array 10 and the control circuit 30.

Figure 3:
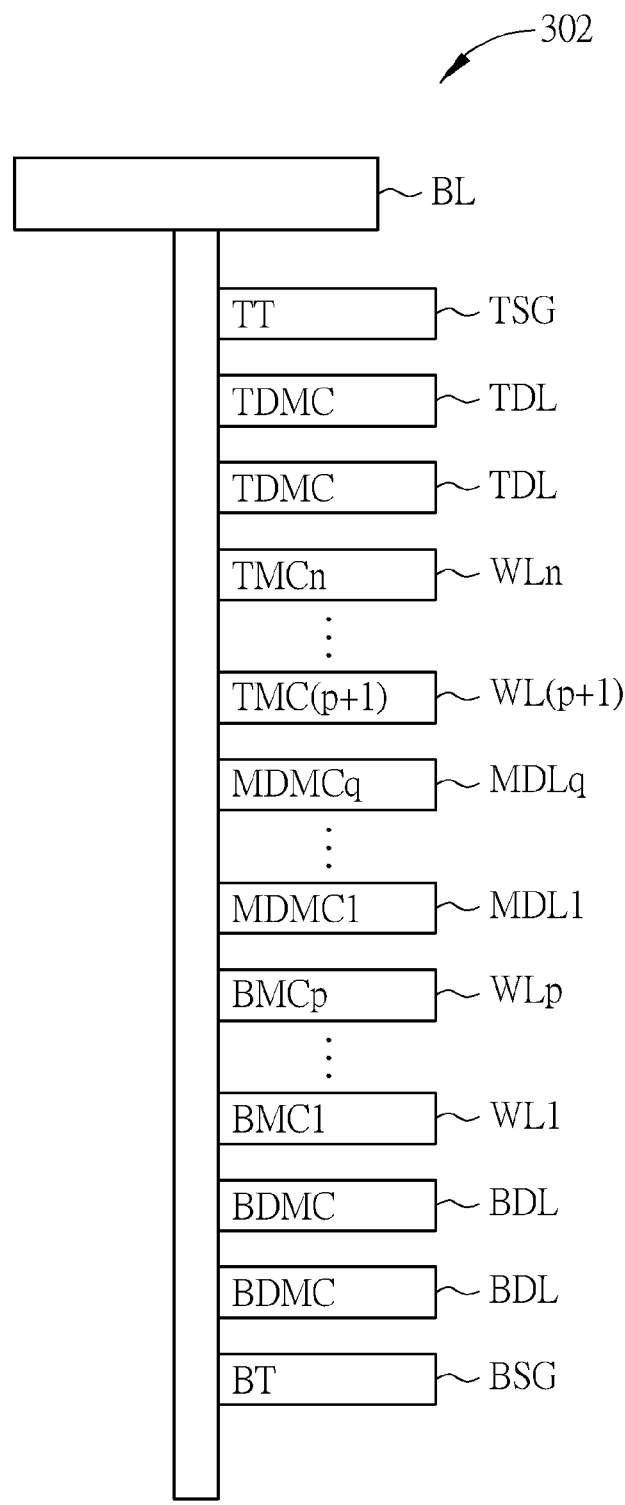
FIG. 3 is a schematic diagram illustrating a memory string and related connection lines of the non-volatile memory device shown in FIG. 2 according to an embodiment of the present disclosure.

Please refer to FIG. 3, which is a schematic diagram illustrating a memory string 302 and related connection lines of the non-volatile memory device 1 shown in FIG. 2 according to an embodiment of the present disclosure. The memory string 302 of the memory array 10 includes, but not limited thereto, a top select gate transistor TT, top dummy memory cells TDMC, top memory cells TMC(p+1) to TMCn, middle dummy memory cells MDMC1 to MDMCq, bottom memory cells BMC1 to BMCp, bottom dummy memory cells BDMC and a bottom select gate transistor BT. A bit line BL is coupled to the memory string 302. A top select gate line TSG is connected to the top select gate transistor TT of the memory string 302. The top dummy memory cells TDMC are connected in series with the top select gate transistor TT. Top dummy word lines TDL are connected to the top dummy memory cells TDMC. Each top dummy word line TDL is separately connected to a top dummy memory cell TDMC. The top memory cells TMC(p+1) to TMCn and bottom memory cells BMC1 to BMCp can be configured to store data. The top memory cells TMC(p+1) to TMCn can be connected in series with the top dummy memory cells TDMC. Word lines WL(p+1) to WLn are connected to the top memory cells TMC(p+1) to TMCn. Each of the word lines WL(p+1) to WLn is separately connected to a memory cell of the top memory cells TMC(p+1) to TMCn. The top memory cells TMC(p+1) to TMCn are disposed sequentially along a first direction between the top dummy memory cells TDMC and the middle dummy memory cells and accordingly the word lines WL(p+1) to WLn are disposed sequentially along the first direction between the top dummy word lines TDL and the middle dummy word line MDLq.

Moreover, the middle dummy memory cells MDMC1 to MDMCq can be connected in series with the top memory cells TMC(p+1) to TMCn. Middle dummy word lines MDL1 to MDLq are connected to the middle dummy memory cells MDMC1 to MDMCq. Each of the middle dummy word lines MDL1 to MDLq is separately connected to a dummy memory cell of the middle dummy memory cells MDMC1 to MDMCq. The middle dummy memory cells MDMC1 to MDMCq are disposed sequentially along the first direction between the top memory cell TMC(p+1) and the bottom memory cell BMCp and accordingly the middle dummy word lines MDL1 to MDLq are disposed sequentially along the first direction between the word line WL(p+1) and the word line WLp. The bottom memory cells BMC1 to BMCp can be connected in series with the middle dummy memory cells MDMC1 to MDMCq. Word lines WL1 to WLp are connected to the bottom memory cells BMC1 to BMCp. Each of the word lines WL1 to WLp is separately connected to a memory cell of the bottom memory cells BMC1 to BMCp. The bottom memory cells BMC1 to BMCp are disposed sequentially along a first direction between the middle dummy memory cells MDMC1 and the bottom dummy memory cells BDMC and accordingly the word lines WL1 to WLp are disposed sequentially along the first direction between the middle dummy word lines MDL1 and the bottom dummy word lines BDL. The bottom dummy memory cells BDMC are connected in series with the bottom memory cells BMC1 to BMCp. Bottom dummy word line BDL are connected to the bottom dummy memory cells BDMC. Each bottom dummy word line BDL is separately connected to a bottom dummy memory cell BDMC. The bottom select gate transistor BT is connected in series with the bottom dummy memory cell BDMC. A bottom select gate line BSG is connected to the bottom select gate transistor BT. Writing and erasing data in the memory cells can be controlled from the control circuits and external circuits through the connection lines of the non-volatile memory device 1. Note that, the amount of the top select gate transistor, the top dummy memory cell, the top memory cell, the middle dummy memory cell, the bottom memory cell, the bottom dummy memory cell and the bottom select gate transistor may be not limited, and may be varied and designed in accordance with practical system demands and requirements.

During a pre-charge period (before programming), the control circuit 30 is configured to apply a bit line pre-pulse signal to unselected bit lines BL of unselected memory strings of the memory array 10. For example, for each unselected memory string, the control circuit 30 is configured to apply a bit line pre-pulse signal VP_BL to an unselected bit line BL of each unselected memory string during the pre-charge period. The control circuit 20 is configured to apply a top select gate pre-pulse signal VP_TSG to the top select gate line TSG and apply a bottom select gate pre-pulse signal VP_BSG to the bottom select gate line BSG. Moreover, the control circuit 20 is configured to apply a selected word line signal to a selected word line of the word lines WL1 to WLn. The control circuit 20 is configured to apply an unselected word line signal to unselected word lines of the word lines WL1 to WLn. The control circuit 20 is configured to apply a dummy word line pre-pulse signal to the top dummy word lines TDL and the bottom dummy word lines BDL. The control circuit 20 is also configured to apply a negative pre-pulse signal VP_NDMY to the middle dummy word lines MDL1 to MDLq connected to the middle dummy memory cells MDMC1 to MDMCq and disposed between the word line WL(p+1) and the word line WLp. The voltage level of the negative pre-pulse signal VP_NDMY applied to the middle dummy memory cells MDMC1 to MDMCq disposed between the word line WL(p+1) and the word line WLp may be a negative value. The voltage level of the negative pre-pulse signal applied to the middle dummy memory cells MDMC1 to MDMCq disposed between the word line WL(p+1) and the word line WLp may be lower than a voltage level of a ground voltage.

Figure 4:
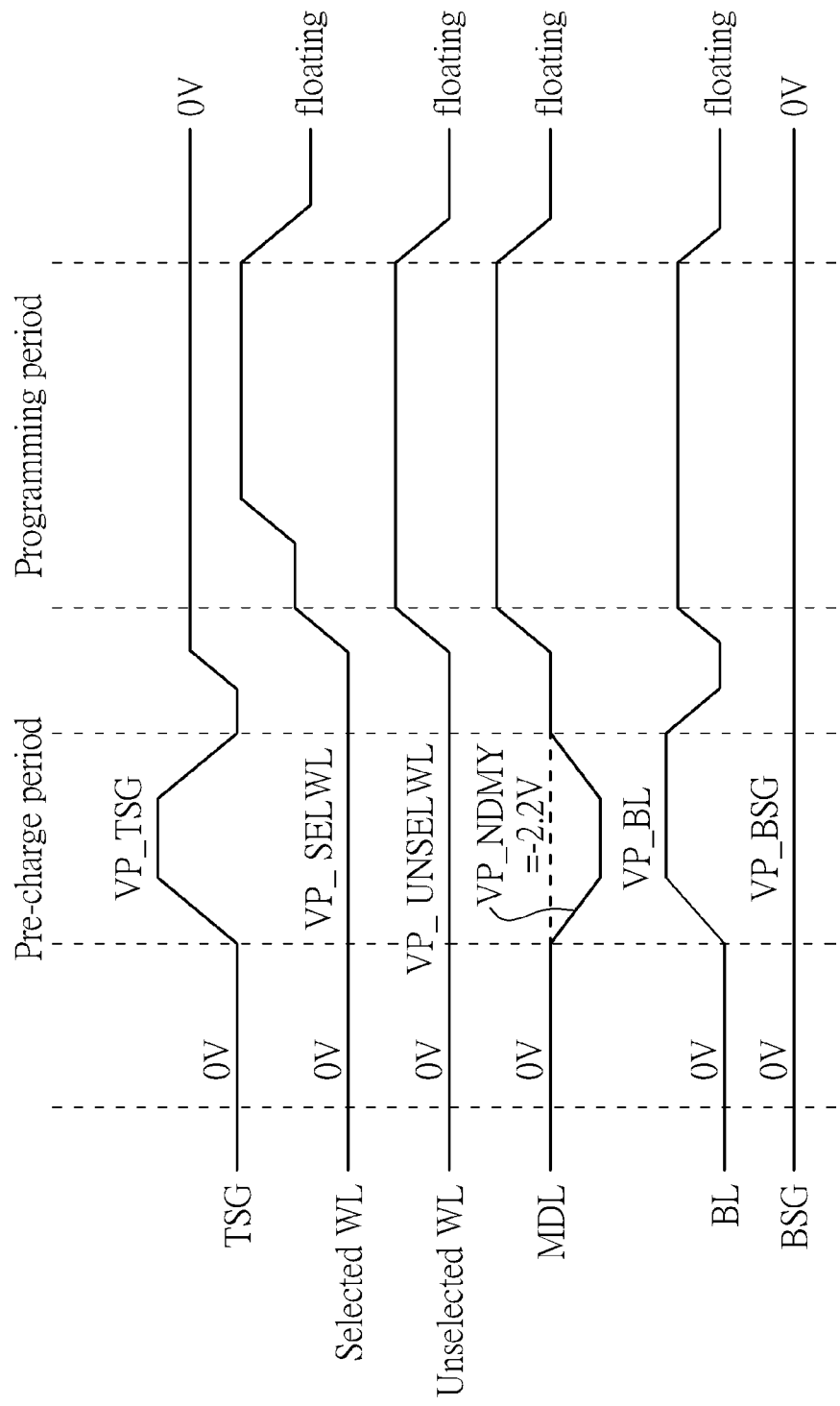
FIG. 4 is a signal timing diagram of the memory string shown in FIG. 3 according to an embodiment of the present disclosure.

Please further refer to FIG. 3 and FIG. 4. FIG. 4 is a signal timing diagram of the memory string shown in FIG. 3 according to an embodiment of the present disclosure. Sequentially from the top of FIG. 4, the signal waveforms in a pre-charge period are: a top select gate pre-pulse signal VP_TSG, a selected word line signal VP_SELWL, an unselected word line signal VP_UNSELWL, a negative pre-pulse signal VP_NDMY, a bit line pre-pulse signal VP_BL and a bottom select gate pre-pulse signal VP_BSG. During the pre-charge period, the bit line pre-pulse signal VP_BL is applied to the unselected bit line BL of the unselected memory string 302 of the memory array 10. The top select gate pre-pulse signal VP_TSG is applied to the top select gate line TSG. The selected word line signal VP_SELWL is applied to a selected word line. The unselected word line signal VP_UNSELWL is applied to unselected word lines. The negative pre-pulse signal VP_NDMY is applied to the middle dummy memory cells MDMC1 to MDMCq disposed between the word line WL(p+1) and the word line WLp. In an embodiment, as shown in FIG. 4, the voltage level (−2.2 volts) of the negative pre-pulse signal VP_NDMY is a negative voltage value. The bottom select gate pre-pulse signal VP_BSG is applied to the bottom select gate line BSG. The bit line pre-pulse signal VP_BL applied to the unselected bit line BL may be a first power supply voltage. The top select gate pre-pulse signal VP_TSG applied to the top select gate line TSG may be a second power supply voltage.

Figure 5:
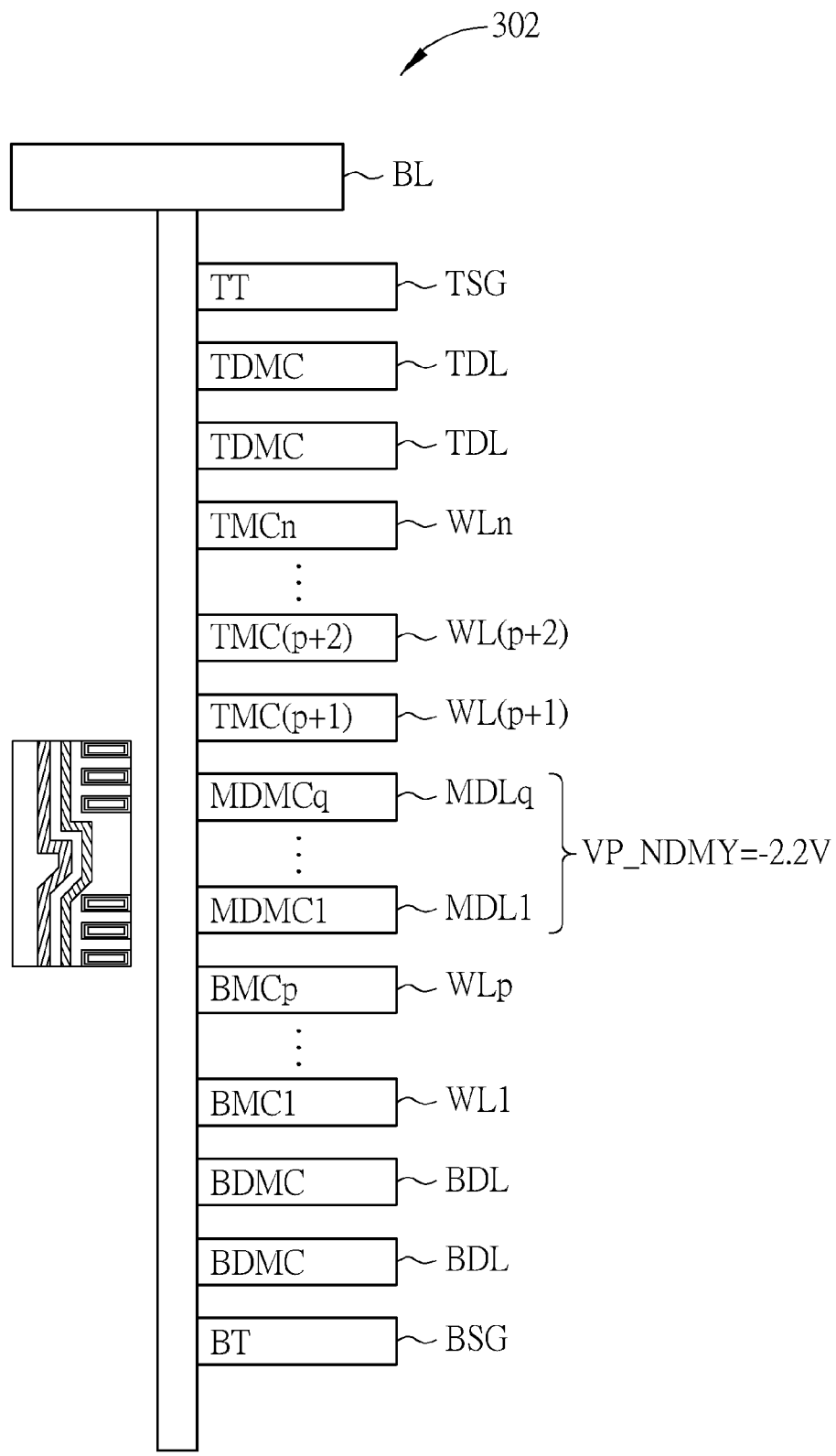
FIG. 5 is a schematic diagram illustrating a memory string applied negative pre-pulse according to an embodiment of the present disclosure.

Please further refer to FIG. 4 and FIG. 5. FIG. 5 is a schematic diagram illustrating a memory string with the negative pre-pulse signal VP_NDMY according to an embodiment of the present disclosure. Suppose the top memory cells TMC(p+1) connected to the word line WL(p+1) has been programmed. The top memory cells TMC(p+2) connected to the word line WL(p+2) is going to be programmed and the word line WL(p+2) is the selected word line. During a pre-charge period, the bit line pre-pulse signal VP_BL is applied to the unselected bit line BL of the unselected memory string 302 by the control circuit 30. The top select gate pre-pulse signal VP_TSG is applied to the top select gate line TSG and the bottom select gate pre-pulse signal VP_BSG is applied to the bottom select gate line BSG by the control circuit 20 during the pre-charge period. The selected word line signal VP_SELWL is applied to the word line WL(p+2) and the unselected word line signal VP_UNSELWL is applied to the rest word lines (unselected word lines) by the control circuit 20 during the pre-charge period.

Moreover, the negative pre-pulse signal VP_NDMY (e.g., −2.2 volts) is applied to the middle dummy memory cells MDMC1 to MDMCq disposed between the word line WL(p+1) during the pre-charge period by the control circuit 20. Although, the channel would be cut off after the top memory cells TMC(p+1) connected to the word line WL(p+1) is programmed and operations of removing the residual electron from the channel may be influenced during the pre-charge period. As the negative pre-pulse signal VP_NDMY applied to the middle dummy memory cells MDMC1 to MDMCq is a negative voltage, the electrons in the region of the middle dummy memory cells MDMC1 to MDMCq would be repelled by the negative pre-pulse signal VP_NDMY, so as to facilitate reducing charge trap effect due to the low threshold voltage, reduce residual electrons within the memory string and increase the channel potential. In the conventional method, the dummy memory cells neighboring the connecting junction of the lower deck and the upper deck are usually arranged in an initial state (e.g., a 0 volt (0V) is applied to the middle dummy word lines NDL1 to MDLq) in order to avoid the threshold voltage shift of the dummy memory cells, and thereby the residual electrons of the channel would remain trapped and gathered in the region of the dummy memory cells neighboring the connecting junction of the stacked decks. Compared with the conventional method, the embodiments of the present disclosure can effectively avoid the programming disturb by using the negative pre-pulse applied to the dummy word lines disposed between of the top word lines and bottom word lines.

In summary, the embodiments of the present disclosure provide the negative pre-pulse signal to drive the dummy memory cells between the top memory cells of the upper deck and the bottom memory cells of the lower deck via the dummy word lines, thus effectively enhancing the channel potential and reducing programming disturb.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a memory array comprising memory strings, each memory string comprising a plurality of top memory cells, a plurality of bottom memory cells, and one or more dummy memory cells between the top memory cells and the bottom memory cells;
a plurality of word lines respectively coupled to the top memory cells and the bottom memory cells;
one or more dummy word lines respectively coupled to the one or more dummy memory cells; and
a control circuit configured to program a target memory cell coupled to a selected word line of the plurality of word lines, wherein, to program the target memory cell, the control circuit is configured to apply a biased dummy word line pre-pulse signal to the one or more dummy word lines in a pre-charge period prior to a programming period, wherein the biased dummy word line pre-pulse signal is a negative voltage signal.

2. The memory device of claim 1, wherein
the control circuit is configured to program in a direction from the bottom memory cells to the top memory cells; and
the target memory cell is one of the top memory cells.

3. The memory device of claim 1, further comprising a bit line coupled to an unselected memory string of the memory strings, wherein, to program the target memory cell, the control circuit is further configured to apply a biased bit line pre-pulse signal to the bit line in the pre-charge period.

4. The memory device of claim 3, wherein the target memory cell is in a selected memory string of the memory strings different from the unselected memory string.

5. The memory device of claim 3, wherein the biased bit line pre-pulse signal is a positive voltage signal.

6. The memory device of claim 3, wherein, to program the target memory cell, the control circuit is further configured to:
- apply a selected word line signal to the selected word line in the pre-charge period; and
- apply an unselected word line signal to unselected word lines of the plurality of word lines in the pre-charge period.

7. The memory device of claim 6, wherein the selected word line signal and the unselected word line signal each is a ground voltage.

8. The memory device of claim 3, wherein
- the unselected memory string further comprises a top select gate (TSG) transistor between the bit line and the top memory cells; and
- to program the target memory cell, the control circuit is further configured to apply a biased TSG pre-pulse signal to the TSG transistor in the pre-charge period.

9. The memory device of claim 8, wherein the biased TSG pre-pulse signal is a positive voltage signal.

10. A method for programming a memory device, the memory device comprising memory strings, each memory string comprising a plurality of top memory cells, a plurality of bottom memory cells, and one or more dummy memory cells between the top memory cells and the bottom memory cells, the method comprising:
- programming a target memory cell coupled to a selected word line of a plurality of word lines, the plurality of word lines being respectively coupled to the top memory cells and the bottom memory cells,
- wherein programming the target memory cell comprises applying a biased dummy word line pre-pulse signal to one or more dummy word lines in a pre-charge period prior to a programming period, the one or more dummy word lines being respectively coupled to the one or more dummy memory cells, wherein the biased dummy word line pre-pulse signal is a negative voltage signal.

11. The method of claim 10, wherein
- the memory device is programmed in a direction from the bottom memory cells to the top memory cells; and
- the target memory cell is one of the top memory cells.

12. The method of claim 10, wherein
- the memory device further comprises a bit line coupled to an unselected memory string of the memory strings; and
- programming the target memory cell further comprises applying a biased bit line pre-pulse signal to the bit line in the pre-charge period.

13. The method of claim 12, wherein the target memory cell is in a selected memory string of the memory strings different from the unselected memory string.

14. The method of claim 12, wherein the biased bit line pre-pulse signal is a positive voltage signal.

15. The method of claim 12, wherein programming the target memory cell further comprises:
- applying a selected word line signal to the selected word line in the pre-charge period; and
- applying an unselected word line signal to unselected word lines of the plurality of word lines in the pre-charge period.

16. The method of claim 15, wherein the selected word line signal and the unselected word line signal each is a ground voltage.

17. The method of claim 12, wherein
- the unselected memory string further comprises a top select gate (TSG) transistor between the bit line and the top memory cells; and
- programming the target memory cell further comprises applying a biased TSG pre-pulse signal to the TSG transistor in the pre-charge period.

18. The method of claim 17, wherein the biased TSG pre-pulse signal is a positive voltage signal.

* * * * *